(12) United States Patent
Lu

(10) Patent No.: US 7,841,388 B2
(45) Date of Patent: Nov. 30, 2010

(54) RADIATING FIN ASSEMBLY FOR THERMAL MODULE

(75) Inventor: Chien-Yen Lu, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 360 days.

(21) Appl. No.: 12/047,986

(22) Filed: Mar. 13, 2008

(65) Prior Publication Data

US 2009/0229789 A1    Sep. 17, 2009

(51) Int. Cl.
*F28F 7/00* (2006.01)
*F28D 15/00* (2006.01)
*H05K 7/20* (2006.01)

(52) U.S. Cl. .................. 165/104.33; 165/80.3; 361/700

(58) Field of Classification Search ............ 165/104.33, 165/80.3; 361/700
See application file for complete search history.

(56) References Cited

U.S. PATENT DOCUMENTS

| | | | | |
|---|---|---|---|---|
| 6,595,275 B1 * | 7/2003 | Wang et al. ................. | 165/185 |
| 6,675,884 B1 * | 1/2004 | Shen .......................... | 165/181 |
| 6,717,813 B1 * | 4/2004 | Garner ....................... | 361/700 |
| 6,860,321 B2 * | 3/2005 | Ji-Hai et al. ................ | 165/80.3 |
| 7,028,755 B2 * | 4/2006 | Fu et al. .................... | 165/80.3 |
| 7,296,617 B2 | 11/2007 | Lee et al. | |
| 2004/0182543 A1 * | 9/2004 | Shao .......................... | 165/80.3 |
| 2005/0103474 A1 * | 5/2005 | Lee et al. ............... | 165/104.33 |
| 2006/0054307 A1 * | 3/2006 | Lee et al. ................... | 165/80.3 |
| 2007/0006997 A1 * | 1/2007 | Hsieh ..................... | 165/104.33 |
| 2009/0120611 A1 * | 5/2009 | Shen .......................... | 165/80.3 |
| 2009/0229790 A1 * | 9/2009 | Lu ............................. | 165/80.3 |

* cited by examiner

*Primary Examiner*—Cheryl J Tyler
*Assistant Examiner*—Brandon M Rosati

(57) ABSTRACT

A radiating fin assembly for a thermal module includes a plurality of radiating fins being mounted on a top of a heat radiating base of the thermal module with a heat pipe located between the radiating fins and the base. Each of the radiating fins is provided at a predetermined position with a downward opened curved notch for engaging with the heat pipe. A first extension is outward extended from a top of the curved notch and perpendicular to the radiating fin, and a second extension is perpendicularly extended from an outer edge of the first extension. When the radiating fin assembly is mounted on the top of the heat radiating base, the second extensions apply a downward pressure to the heat pipe, bringing the heat pipe to more tightly contact with the heat radiating base.

1 Claim, 5 Drawing Sheets

RADIATING FIN ASSEMBLY FOR THERMAL MODULE

FIELD OF THE INVENTION

The present invention relates to a radiating fin assembly for thermal module, and more particularly to a radiating fin assembly mounted on a heat radiating base of a thermal module to tightly press a heat pipe against the heat radiating base.

BACKGROUND OF THE INVENTION

With the highly developed semiconductor technology, the currently available integrated circuits (ICs) have a largely reduced volume than before. To enable the ICs to process more data, the number of elements and components included in the current ICs is often several times of that in the conventional ICs having the same volume. However, heat produced by the ICs during operation thereof increases with the growing number of electronic elements and components in the ICs. For example, the heat produced by a common central processing unit (CPU) at full working load is high enough for burning out the whole CPU. Therefore, it is important to develop effective heat radiating means for the ICs.

Generally, a thermal module is made of a metal material with high heat conductivity. In addition to the mounting of a cooling fan to carry away the heat produced by heat-producing elements, the thermal module in the form of a radiating fin assembly is frequently used to obtain an enhanced heat radiating effect. In some other cases, heat pipes are further provided on the thermal module to more quickly transfer and dissipate heat, so that products with ICs are protected against burning out.

FIG. 1 is an exploded perspective view of a conventional thermal module 1, which includes a heat radiating base 11, on which a tubular groove 111 is provided; a radiating fin assembly 13 mounted on a top of the heat radiating base 11, and a heat pipe 12 received in the tubular groove 111 to locate between the heat radiating base 11 and the radiating fin assembly 13.

The radiating fin assembly 13 includes a plurality of radiating fins, each of which is bent at a lower edge to form a flange 131, and a downward opened curved notch 132 is also formed at the lower edge of the radiating fin.

When the radiating fin assembly 13 is mounted to the top of the heat radiating base 11, the curved notches 132 are engaged with the heat pipe 12, and the flanges 131 are pressed against the top of the heat radiating base 11. With these arrangements, heat transmitted to the heat radiating base 11 and the heat pipe 12 maybe quickly transferred to the plurality of radiating fins of the radiating fin assembly 13 via the flanges 131 to thereby provide upgraded heat dissipating efficiency.

However, the following disadvantage is found in manufacturing the above-structured conventional thermal module 1:

Generally, metal parts are connected to one another by way of welding. Therefore, the radiating fin assembly 13 is connected to the heat radiating base 11 by welding the flanges 131 to the top of the heat radiating base 11. Thereafter, the heat pipe 12 is extended through the tubular groove 111. Since the heat pipe 12 is not always a fully straight member but might include some bent portions, there are clearances existed between the heat pipe 12 and the tubular groove 111 to create the problem of thermal resistance, resulting in a reduced heat conducting efficiency between the heat radiating base 11 and the radiating fin assembly 13.

It is therefore tried by the inventor to develop a radiating fin assembly for thermal module that enables a heat pipe to tightly contact with the heat radiating base of the thermal module to ensure good heat conducting efficiency of the thermal module.

SUMMARY OF THE INVENTION

A primary object of the present invention is to provide a radiating fin assembly, which is mounted on a heat radiating base of a thermal module while presses against a heat pipe, so that the heat pipe is brought to more tightly contact with the heat radiating base.

To achieve the above and other objects, the radiating fin assembly for thermal module according to the present invention includes a plurality of parallelly arranged radiating fins, each of which is provided at a predetermined position with a downward opened curved notch. A first extension is outward extended from a top of the curved notch perpendicular to the radiating fin, and a second extension is perpendicularly extended from an outer edge of the first extension. Whereby when the heat pipe is mounted on the heat radiating base, and the radiating fin assembly is mounted on the top of the heat pipe and the heat radiating base, the second extensions of the radiating fins apply a downward pressure to the heat pipe, bringing the heat pipe to more tightly contact with the heat radiating base.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
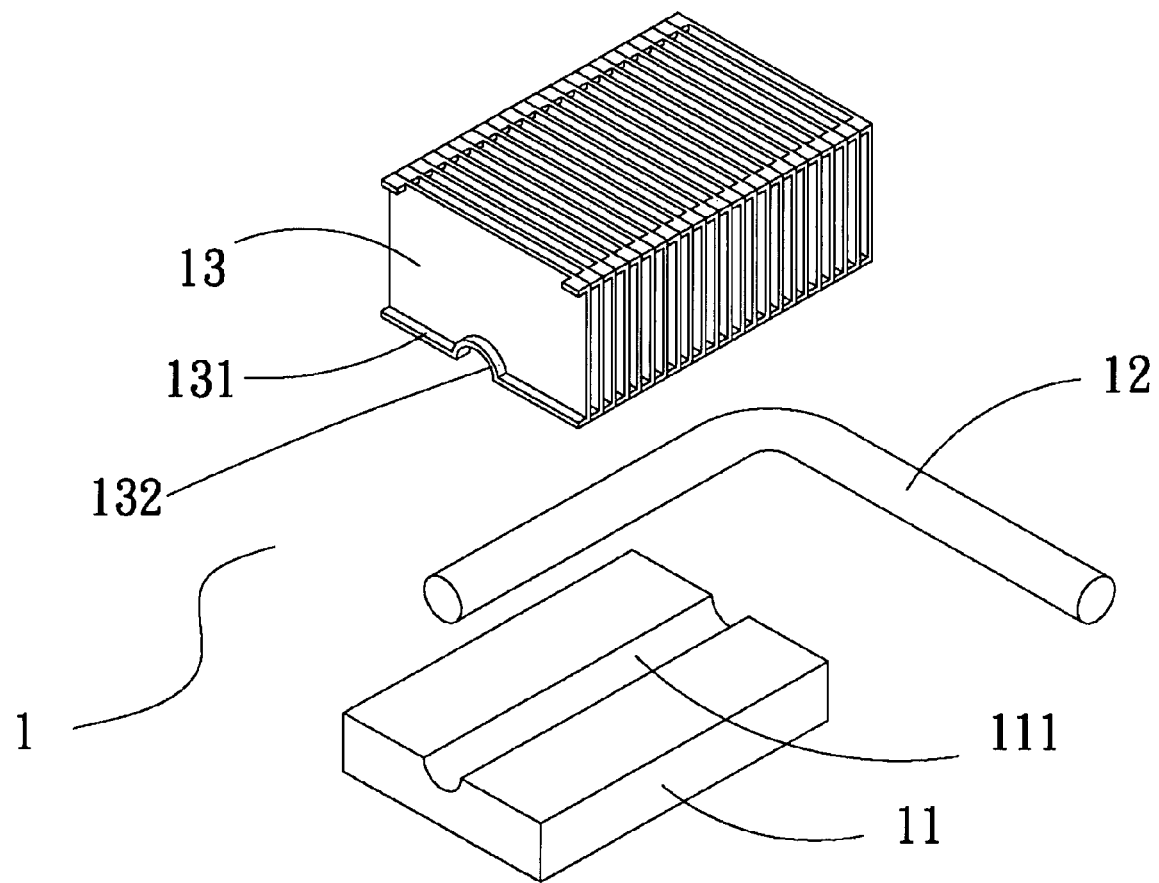
FIG. 1 is an exploded perspective view of a conventional thermal module.
Figure 2:
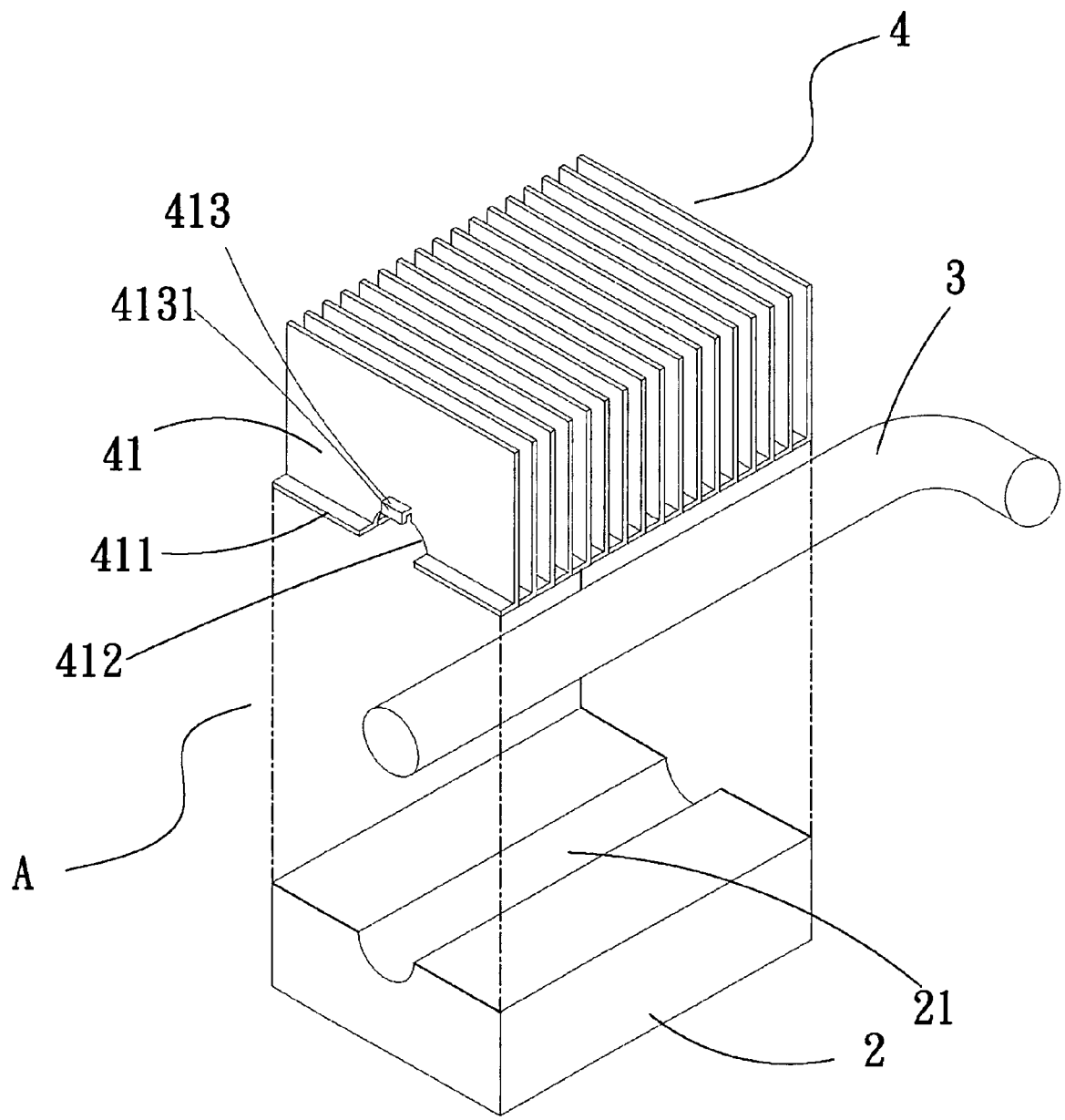
FIG. 2 is an exploded perspective view of a thermal module that adopts a radiating fin assembly according to a preferred embodiment of the present invention.
Figure 3:
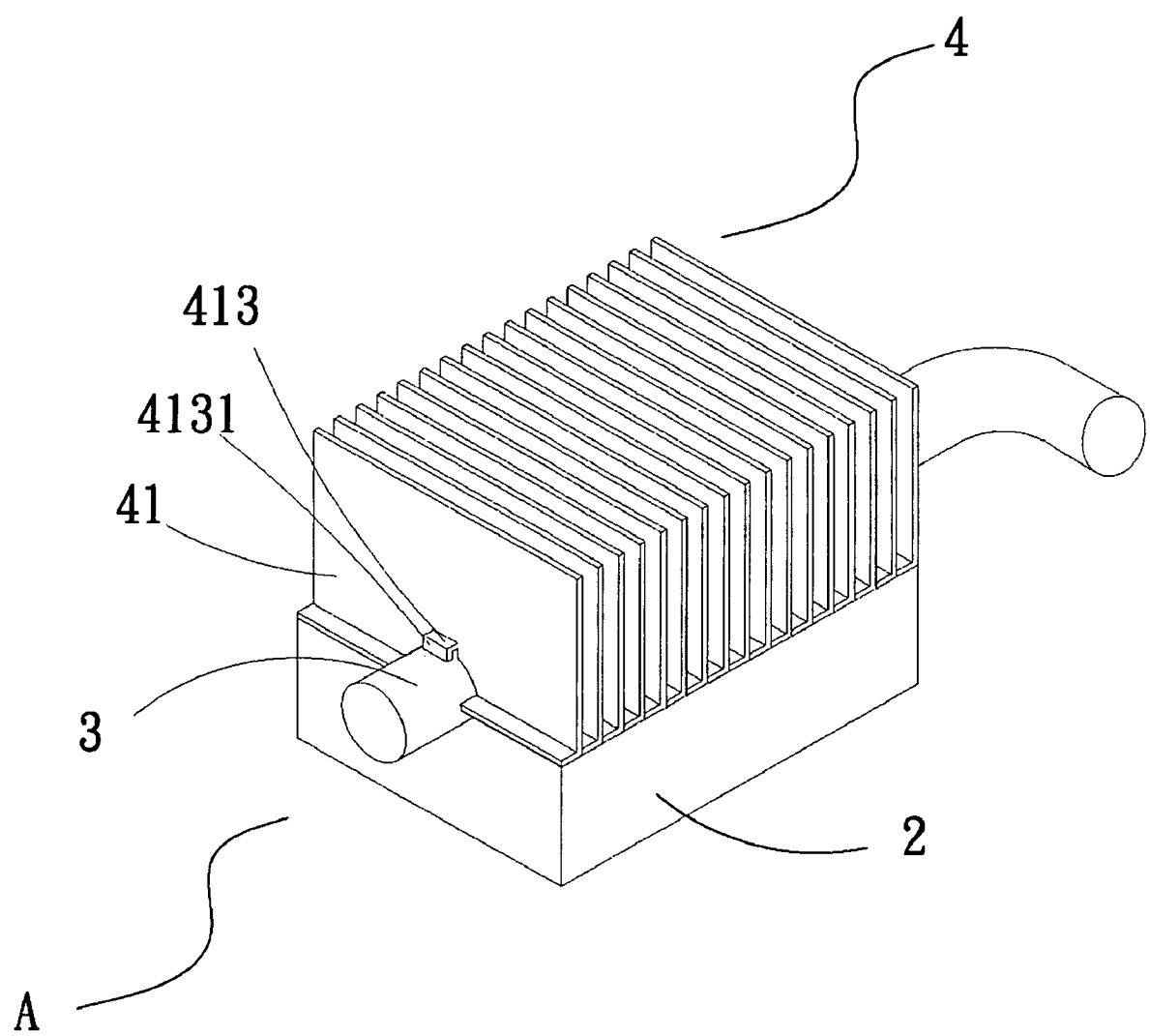
FIG. 3 is an assembled view of FIG. 2.
Figure 4:
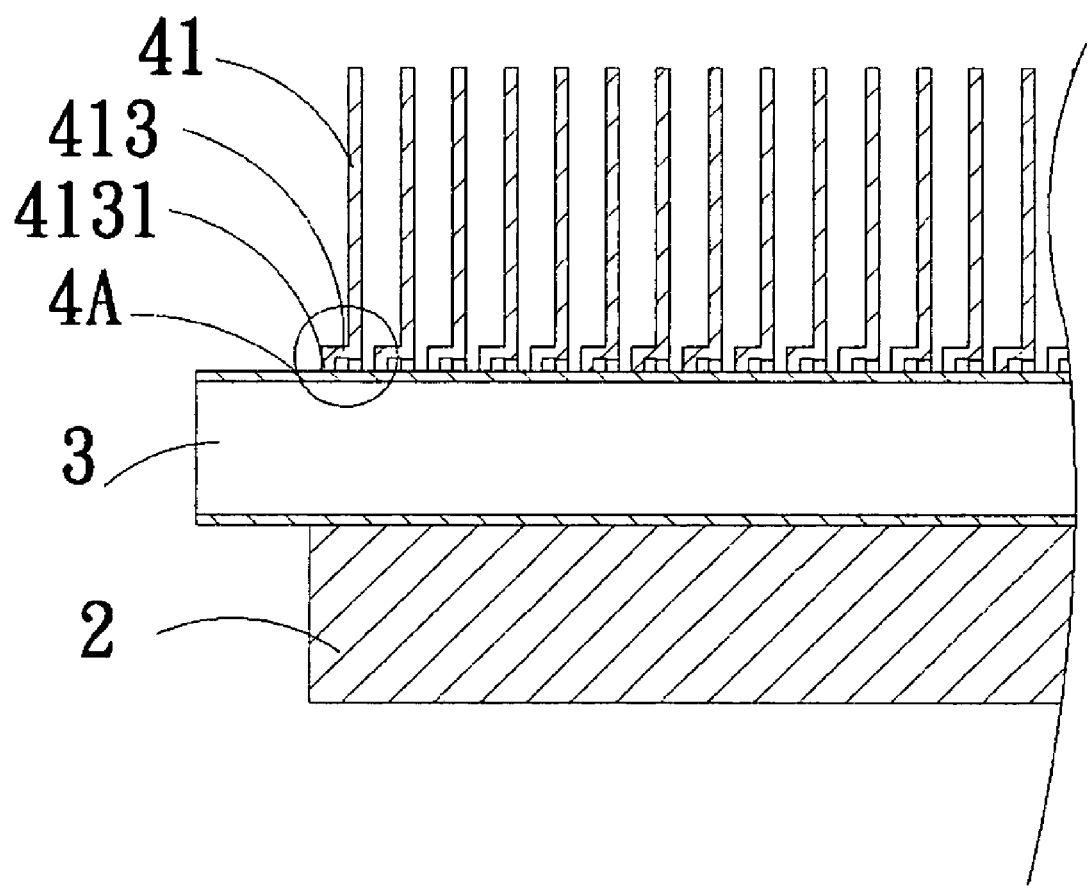
FIG. 4 is a fragmentary sectional view of FIG. 3.

Please refer to FIGS. 2 and 3 that are exploded and assembled perspective views, respectively, of a thermal module A that adopts a radiating fin assembly 4 according to a preferred embodiment of the present invention, and to FIG. 4 that is a fragmentary sectional view of FIG. 3. As shown, the thermal module A includes a heat radiating base 2, a heat pipe 3, and a radiating fin assembly 4.

The heat radiating base 2 is provided on a top with at least one groove 21 having a curved cross section for receiving a lower portion of the heat pipe 3 therein.

The radiating fin assembly 4 includes a plurality of parallelly arranged radiating fins 41. Each of the radiating fins 41 has one lower side bent into a flange 411, and a curved notch 412 is formed on the radiating fin 41 at the same lower side with the flange 411. On a top of the curved notch 412, there are formed a first extension 413 outward extended from and perpendicular to the radiating fin 41 and a second extension 4131 perpendicularly extended from an outer edge of the first extension 413 toward the flange 411. The two extensions forming an L-shaped member. The first extension 413 comprises a first end and a second end, the first end being integral with the radiating fins 41. The second extension 4131 is perpendicularly extended from the second end of the first extension toward the heat pipe.

To assemble the thermal module A, first position the heat pipe 3 in the curved-section groove 21 on the heat radiating base 2. Then, attach the radiating fin assembly 4 to the top of the heat radiating base 2 and the heat pipe 3 received in the groove 21, such that the curved notches 412 on the radiating fins 41 of the radiating fin assembly 4 are fitly engaged with an upper portion of the heat pipe 3 protruded from the groove 21, and the flanges 411 of the radiating fins 41 are pressed against the top of the heat radiating base 2. At this point, the second extensions 4131 on the radiating fins 41 are in contact with and apply a downward pressure against the heat pipe 3, forcing the heat pipe 3 to be more tightly received in the groove 21 and closely contact with the heat radiating base 2.

Figure 4A:
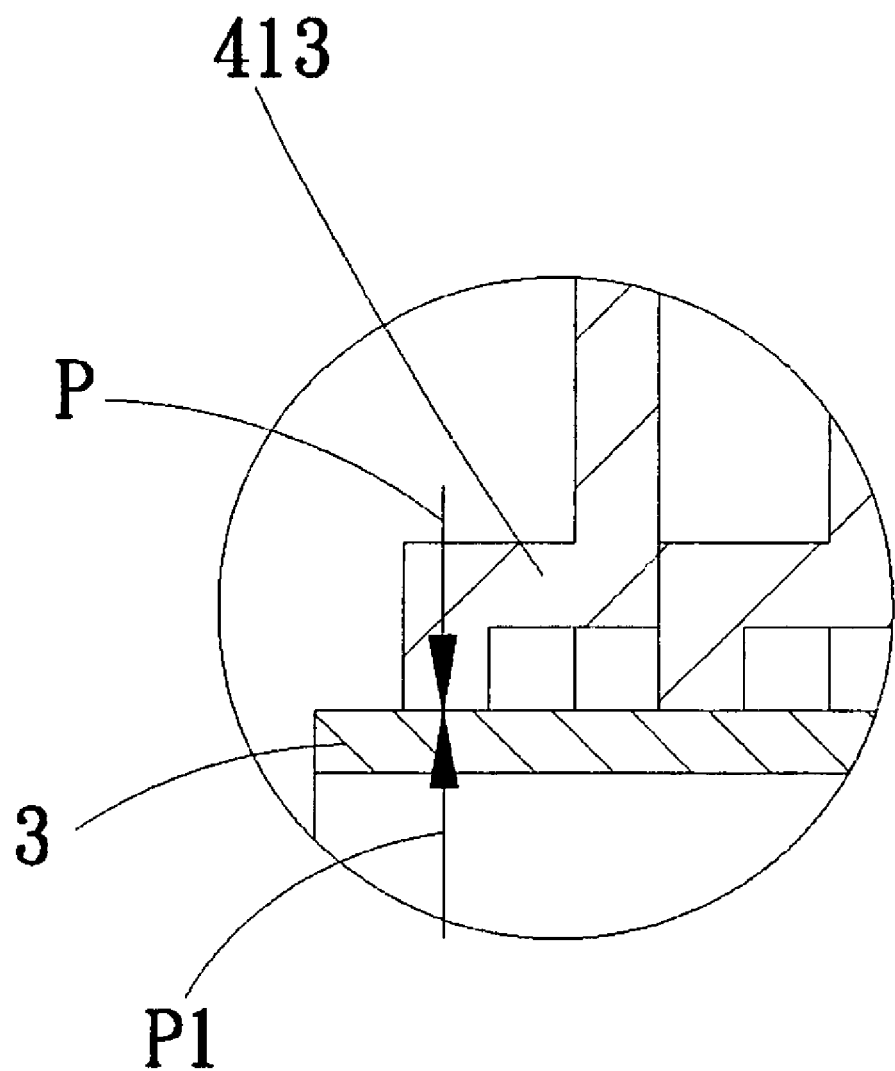
FIG. 4A is an enlarged view of the circled area 4A in FIG. 4.

FIG. 4A is an enlarged view of the circled area A in FIG. 4. As a mechanical property thereof, a metal material deformed under an externally applied force would restore to an initial shape when the external force is released. Such a mechanical property is referred to as an elastic deformation of material. In the present invention, the radiating fins 41 are made of a metal material with elasticity. Therefore, when the radiating fins 41 are subject to an external force and deformed, they may still elastically restore to an initial shape so long as the external force is lower than a yielding point of the metal material. As can be clearly seen from FIG. 4A, each of the first extensions 413 applies a downward pressure P to the heat pipe 3 via the second extension 4131, while the heat pipe 3 generates an upward resistance P1 to the second extension 4131. Since the resistance P1 is smaller than the yielding point of the first extension 413 without causing a permanent deformation of the first extension 413, the first extension 413 still has elasticity to constantly apply the pressure P against the heat pipe 3. Meanwhile, since the downward pressure P applied to the heat pipe 3 via the second extension 4131 is larger than the upward resistance P1 from the heat pipe 3 to the first extension 413, the heat pipe 3 is caused to tightly locate in the groove 21 and closely contact with the heat radiating base 2, as shown in FIG. 4.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A radiating fin assembly for a thermal module, the thermal module including a heat radiating base, on a top of which the radiating fin assembly is mounted with a heat pipe located between the radiating fin assembly and the heat radiating base; the radiating fin assembly comprising a plurality of parallelly arranged radiating fins, each of the radiating fins being provided at a predetermined position with a downward opened curved notch; an L-shaped member having a first extension and a second extension, the first extension being extended outward from a top of the curved notch and perpendicular to the radiating fin; said first extension further comprising a first end and a second end, the first end being integral with the radiating fins and a second extension being perpendicularly extended from an the second end of said first extension and extending toward the heat pipe; whereby when the radiating fin assembly is mounted on the top of the heat radiating base, the second extensions apply a downward pressure to the heat pipe, bringing the heat pipe to more tightly contact with the heat radiating base.

\* \* \* \* \*